United States Patent
Hsu et al.

(10) Patent No.: US 8,858,150 B2
(45) Date of Patent: Oct. 14, 2014

(54) DOOR DETECTION SYSTEM

(75) Inventors: San-Chuan Hsu, New Taipei (TW);
Ming-Hsuan Shao, Taichung (TW);
Yan-Jang Lin, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 480 days.

(21) Appl. No.: 13/304,741

(22) Filed: Nov. 28, 2011

(65) Prior Publication Data

US 2013/0071219 A1 Mar. 21, 2013

(30) Foreign Application Priority Data

Sep. 16, 2011 (TW) .............................. 100133423 A

(51) Int. Cl.
*B65B 21/02* (2006.01)

(52) U.S. Cl.
USPC .......................................................... 414/411

(58) Field of Classification Search
USPC .................................. 414/217, 411, 810, 935
See application file for complete search history.

(56) References Cited

U.S. PATENT DOCUMENTS

| 8,591,163 B2 * | 11/2013 | Toyoda et al. ................ 414/411 |
| 2001/0048866 A1 * | 12/2001 | Sakiya et al. ................ 414/217 |
| 2002/0124906 A1 | 9/2002 | Suzuki et al. |
| 2004/0126207 A1 * | 7/2004 | Englhardt ..................... 414/217 |

FOREIGN PATENT DOCUMENTS

| JP | 09064156 A * | 7/1997 | ................... 414/411 |
| JP | 2000-133697 A | 5/2000 | |
| TW | 533174 B | 5/2003 | |
| TW | M316254 U | 8/2007 | |

OTHER PUBLICATIONS

Communication from the Taiwan Patent Office Regarding a Counter-Part Foreign Application Dated (Taiwan Year 103) Jun. 26, 2014.

* cited by examiner

*Primary Examiner* — Jerry Redman
(74) *Attorney, Agent, or Firm* — Rosenberg, Klein & Lee

(57) ABSTRACT

A door detection system includes a robot arm unit and a movable unit. The robot arm unit includes at least one bearing platform and at least one level sensing structure disposed on the at least one bearing platform. The level sensing structure includes a plurality of contact sensors, and the wafer carrier device is disposed on the at least one level sensing structure. The movable unit includes at least one movable structure disposed on the robot arm unit. The wafer carrier device has a wafer pick-and-place opening corresponding to the door, and one end of the at least one movable structure can selectively contact the door of the wafer carrier device or been inserted into the wafer carrier device from the wafer pick-and-place opening.

10 Claims, 8 Drawing Sheets

DOOR DETECTION SYSTEM

BACKGROUND OF THE INVENTION

1. Field of the Invention

The instant disclosure relates to a door detection system, and more particularly, to a door detection system for judging whether a door of a wafer carrier device is closed or not.

2. Description of Related Art

In semiconductor manufacturing, lots of wafers have to be subjected to a fabrication process with multiple steps so as to be manufactured into desired semiconductor devices. In order to obtain profit, all the semiconductor manufacturers wish to reduce the time required for manufacturing lots of wafers, thereby increasing the yield of the semiconductor fabrication plant. There are many factors to influence the time required for manufacturing the wafers. In addition to the time required for manufacturing wafers on the respective fabrication machine tools, the time for transporting the wafers among different fabrication machine tools is also another critical factor. Hence, a common automatic transport system includes a plurality of overhead transport rail is created.

For example, a plurality of sets of fabrication machine tools is provided below each of the overhead transport rail sets. Each of the overhead transport rail sets defines a bay. The fabrication machine tools disposed in the same bay will be closely related to each other. The transport rail sets are provided with a plurality of overhead hoist transport vehicles (OHT vehicles) or called "vehicles" for short. The vehicles move on the overhead transport rail sets, whereby the wafer carrier can be transported from one fabrication machine tool to another fabrication machine tool. Further, each of the overhead transport rail sets is connected with another overhead transport rail set, so that the vehicles can move into different overhead transport rail sets to thereby transport the wafer carrier into the fabrication machine tool of another bay.

However, there is no door detection system known in the prior art automatic transport systems for determining whether the door of the wafer carrier is closed.

SUMMARY OF THE INVENTION

One aspect of the instant disclosure relates to a door detection system for judging whether a door of a wafer carrier device is closed or not.

One of the embodiments of the instant disclosure provides a door detection system for judging whether a door of a wafer carrier device is closed, comprising: a robot arm unit and a movable unit. The robot arm unit includes at least one bearing platform and at least one level sensing structure disposed on the at least one bearing platform, wherein the level sensing structure includes a plurality of contact sensors, and the wafer carrier device is disposed on the at least one level sensing structure. The movable unit includes at least one movable structure disposed on the robot arm unit, wherein the wafer carrier device has a wafer pick-and-place opening corresponding to the door. Therefore, when the door of the wafer carrier device is closed, one end of the at least one movable structure contacts the door of the wafer carrier device and the bottom of the wafer carrier device simultaneously contacts all of the contact sensors. When the door of the wafer carrier device is not closed, one end of the at least one movable structure is inserted into the wafer carrier device from the wafer pick-and-place opening and the bottom of the wafer carrier device simultaneously contacts some of the contact sensors.

Another one of the embodiments of the instant disclosure provides a door detection system for judging whether a door of a wafer carrier device is closed, comprising: a robot arm unit and a movable unit. The robot arm unit includes at least one bearing platform and at least one level sensing structure disposed on the at least one bearing platform, wherein the level sensing structure includes a plurality of contact sensors, and the wafer carrier device is disposed on the at least one level sensing structure. The movable unit includes at least one movable structure disposed on the robot arm unit, wherein the wafer carrier device has a wafer pick-and-place opening corresponding to the door, and one end of the at least one movable structure selectively contacts the door of the wafer carrier device or inserts into the wafer carrier device from the wafer pick-and-place opening.

Therefore, because one end of the at least one movable structure can selectively contact the door of the wafer carrier device or been inserted into the wafer carrier device from the wafer pick-and-place opening, the door detection system of the instant disclosure can be used to judge whether a door of a wafer carrier device is closed or not.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

[First Embodiment]

Referring to FIGS. 1A to 1D, where the first embodiment of the instant disclosure provides a door detection system for judging whether a door D of a wafer carrier device C is closed or not. The door detection system comprises a robot arm unit 1 and a movable unit 2, where the wafer carrier device C can be used to receive and carry a plurality of wafers W.

Figure 1A:
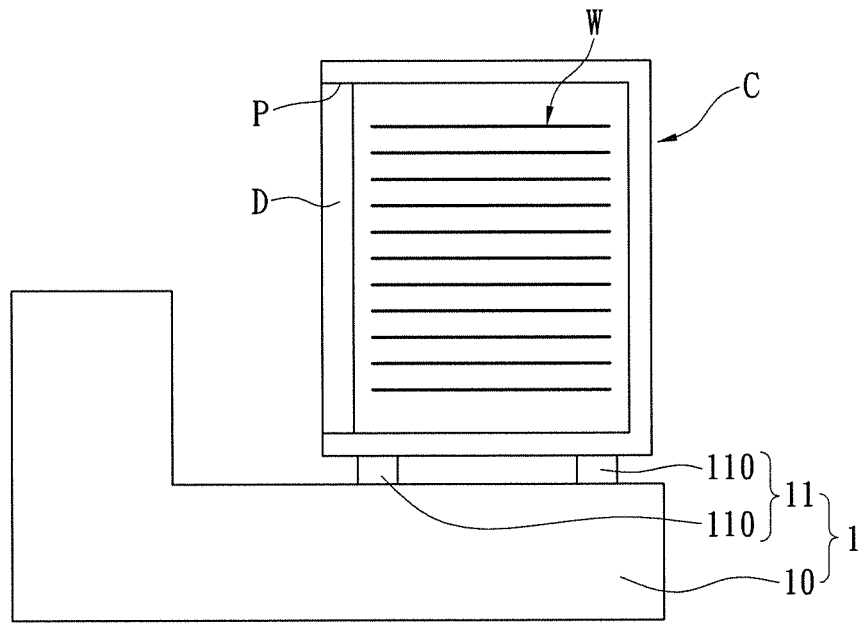
FIG. 1A shows a lateral, schematic view of the wafer carrier device disposed on the robot arm unit according to the first embodiment of the instant disclosure.

Referring to FIG. 1A, the robot arm unit 1 includes at least one bearing platform 10 and at least one level sensing structure 11 disposed on the bearing platform 10. In addition, the level sensing structure 11 includes a plurality of contact sensors 110, and the wafer carrier device C can be disposed on the level sensing structure 11. Of course, the contact sensors 110 can be replaced by non-contact sensors according to different requirements, thus the level sensing structure 11 used in the first embodiment is merely an example and is not meant to limit the instant disclosure.

Figure 1B:
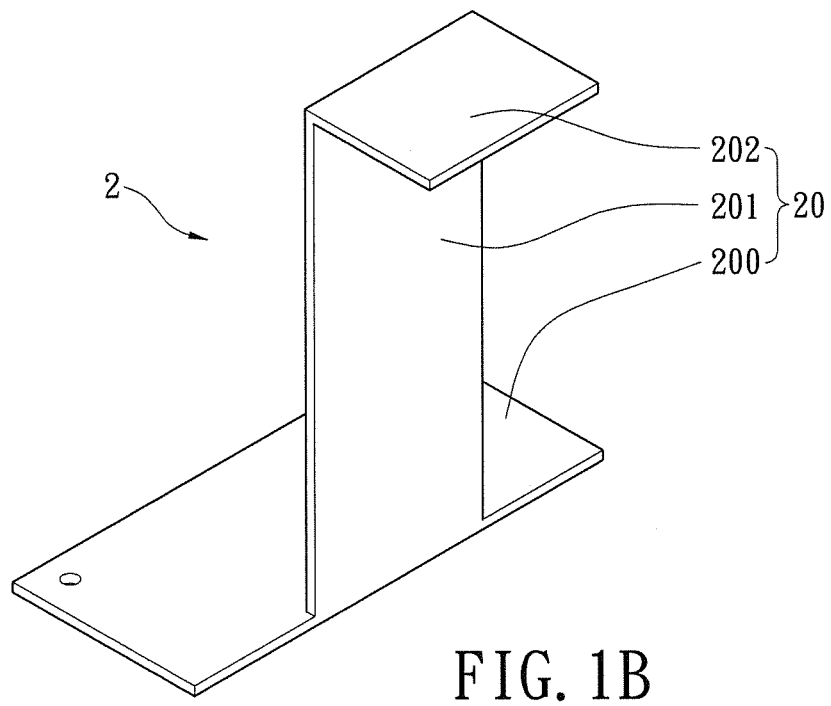
FIG. 1B shows a perspective, schematic view of the movable unit according to the first embodiment of the instant disclosure.
Figure 1C:
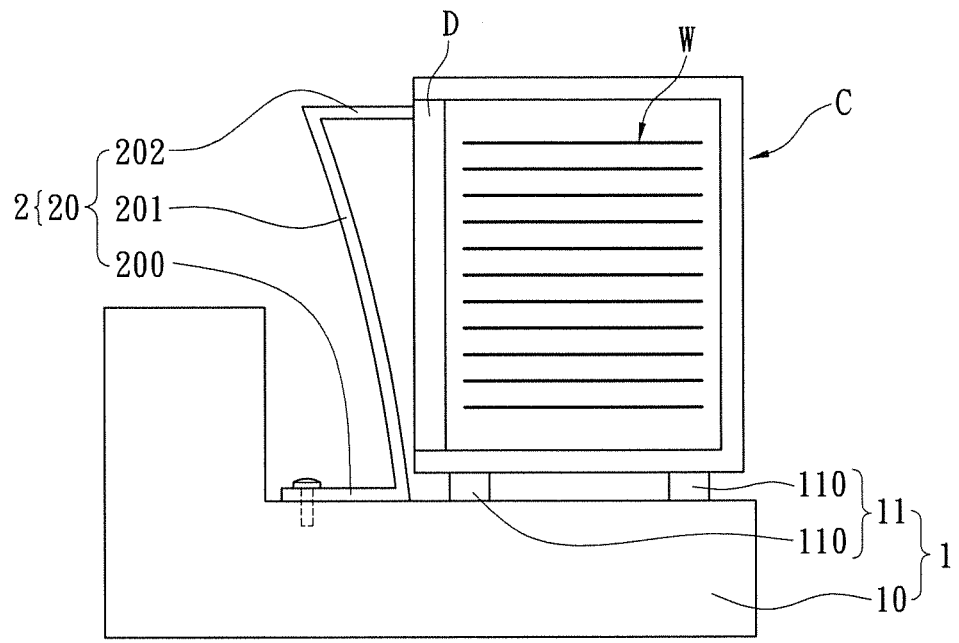
FIG. 1C shows a lateral, schematic view of the movable unit contacting the door of the wafer carrier device according to the first embodiment of the instant disclosure.

Referring to FIGS. 1A, 1B, and 1C, the movable unit 2 includes at least one movable structure 20 disposed on the robot arm unit 1, and the wafer carrier device C has a wafer pick-and-place opening P corresponding to the door D. For example, the movable structure 20 includes a fixing portion 200 fixed on the bearing platform 10, a flexible extending portion 201 extended upwardly from the fixing portion 200, and a contacting portion 202 bent from the flexible extending portion 201. However, the movable structure 20 used in the first embodiment is merely an example and is not meant to limit the instant disclosure.

Referring to FIG. 1C, when the door D of the wafer carrier device C is closed, one end of the movable structure 20 (such as the contacting portion 202) can contact the door D of the wafer carrier device W and the bottom of the wafer carrier device C can simultaneously contact all of the contact sensors 110. In other words, when the door D of the wafer carrier device C is closed, although the contacting portion 202 continuously touches the outer surface of the door D, the robot arm unit 1 can be smoothly and upwardly moved and cannot slant the wafer carrier device C. Therefore, the wafer carrier device C still can be position on the original level position, thus the bottom of the wafer carrier device C can simultaneously contact all of the contact sensors 110. In a word, when all of the contact sensors 110 are touched by the bottom of the wafer carrier device C, the door detection system can obtain the information that the door D of the wafer carrier device C has been closed.

Figure 1D:
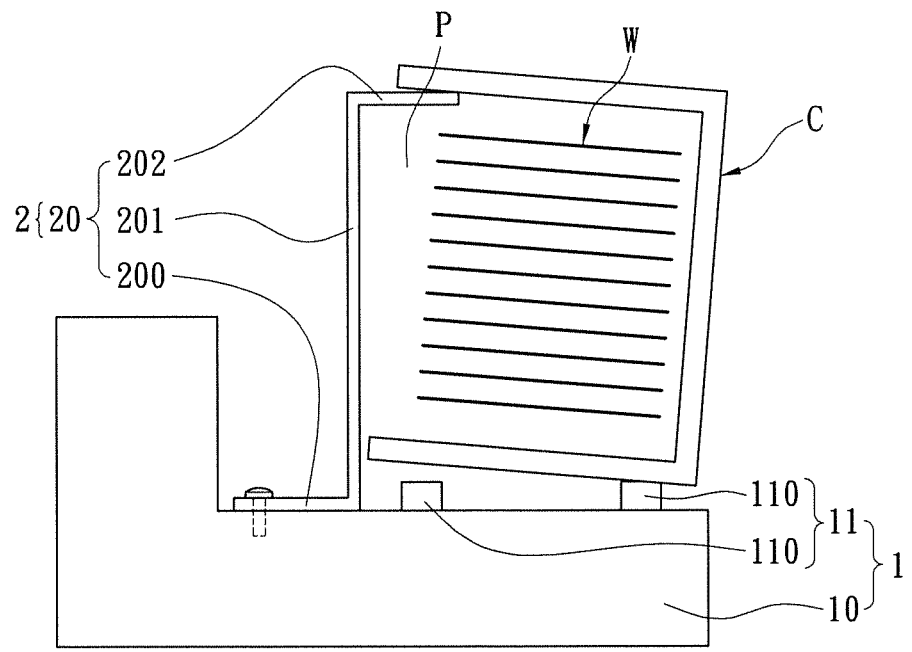
FIG. 1D shows a lateral, schematic view of the movable unit inserted into the wafer carrier device from the wafer pick-and-place opening according to the first embodiment of the instant disclosure.

Referring to FIG. 1D, when the door D of the wafer carrier device C is not closed, one end of the movable structure 20 (such as the contacting portion 202) can be inserted into the wafer carrier device C from the wafer pick-and-place opening P and the bottom of the wafer carrier device C only can simultaneously contact some of the contact sensors 110. In other words, when the door D of the wafer carrier device C is not closed, the robot arm unit 1 is upwardly moved to slant the wafer carrier device C. Therefore, the wafer carrier device C cannot be position on the original level position, thus the bottom of the wafer carrier device C only can simultaneously contact some of the contact sensors 110. In a word, when only some of the contact sensors 110 are touched by the bottom of the wafer carrier device C, the door detection system can obtain the information that the door D of the wafer carrier device C has not been closed.

In conclusion, when the door D of the wafer carrier device C is closed, one end of the movable structure 20 (such as the contacting portion 202) can contact the door D of the wafer carrier device W and the bottom of the wafer carrier device C can simultaneously contact all of the contact sensors 110, thus the door detection system of the instant disclosure can obtain the information that the door D of the wafer carrier device C has been closed. In addition, when the door D of the wafer carrier device C is not closed, one end of the movable structure 20 (such as the contacting portion 202) can be inserted into the wafer carrier device C from the wafer pick-and-place opening P and the bottom of the wafer carrier device C only can simultaneously contact some of the contact sensors 110, thus the door detection system of the instant disclosure can obtain the information that the door D of the wafer carrier device C has not been closed.

[Second Embodiment]

Figure 2A:
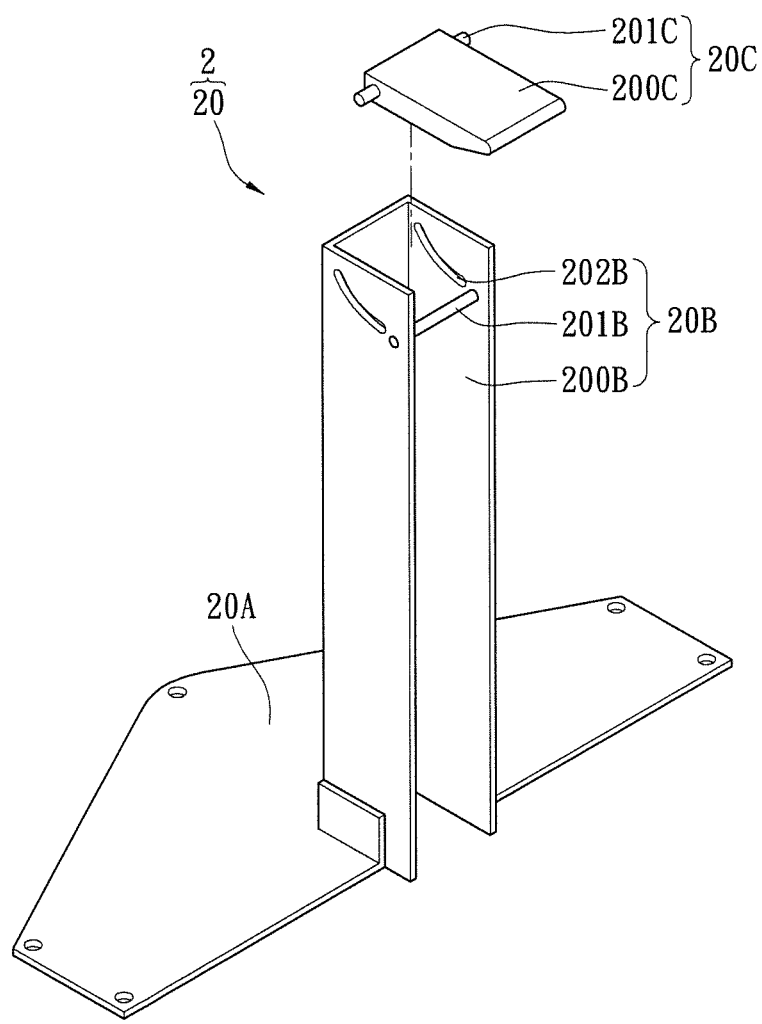
FIG. 2A shows a perspective, exploded, schematic view of the movable unit according to the second embodiment of the instant disclosure.
Figure 2B:
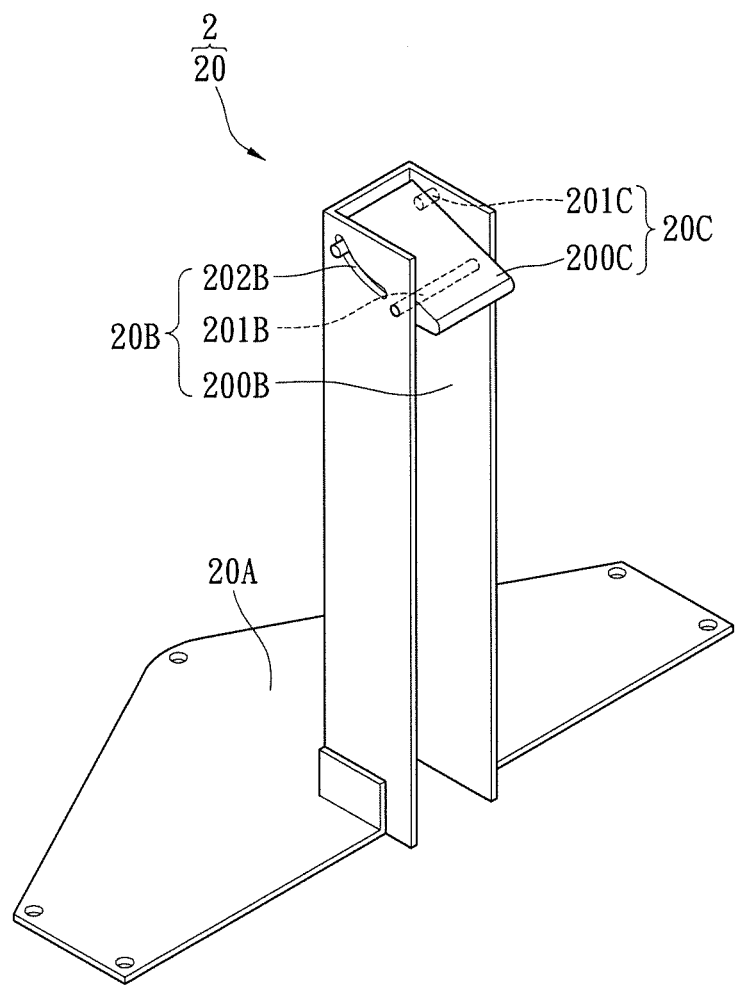
FIG. 2B shows a lateral, schematic view of the movable unit contacting the door of the wafer carrier device according to the second embodiment of the instant disclosure.
Figure 2C:
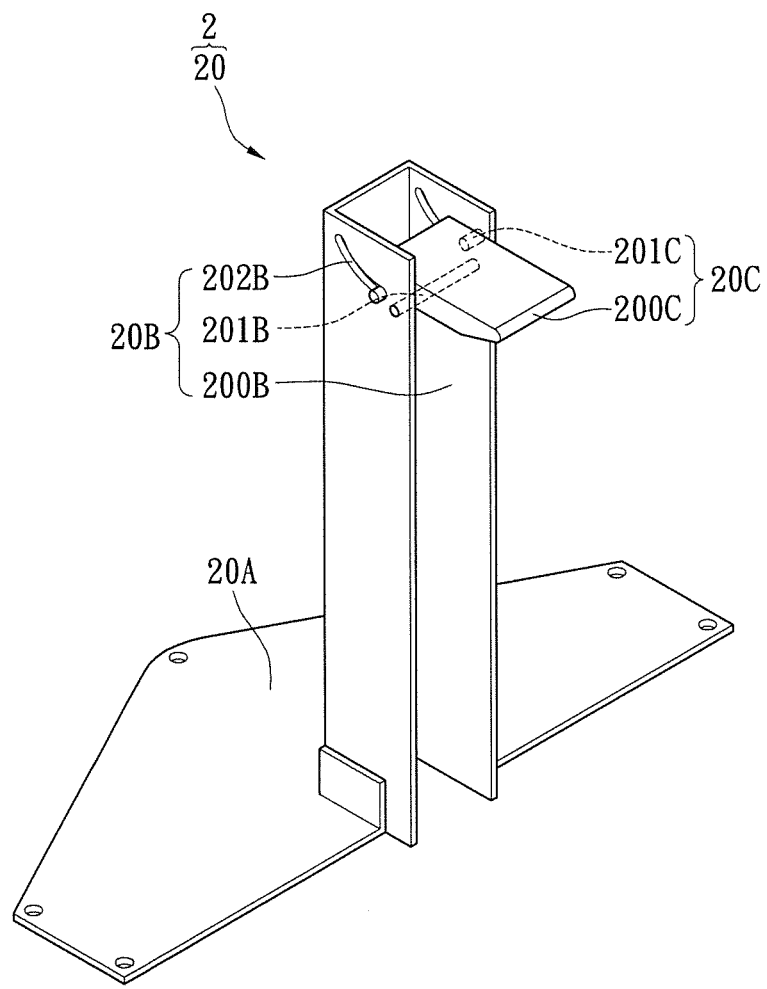
FIG. 2C shows a lateral, schematic view of the movable unit inserted into the wafer carrier device from the wafer pick-and-place opening according to the second embodiment of the instant disclosure.

Referring to FIGS. 2A to 2C, where the second embodiment of the instant disclosure provides a door detection system for judging whether a door D of a wafer carrier device C is closed or not. Comparing FIG. 2B with FIG. 1C and comparing FIG. 2C with FIG. 1D, the difference between the second embodiment and the first embodiment is as follows: in the second embodiment, the movable structure 20 includes a fixing seat 20A fixed on the bearing platform 10, a support frame 20B movably disposed on the fixing seat 20A, and a movable element 20C movably disposed on the support frame 20B to selectively contact the door D of the wafer carrier device W (as shown in FIG. 2B) or insert into the wafer carrier device C from the wafer pick-and-place opening P (as shown in FIG. 2C).

For example, the support frame 20B includes a U-shaped frame body 200B, a position-limiting element 201B disposed between two inner walls of the U-shaped frame body 200B, and two arc-shaped sliding grooves 202B symmetrically formed on the U-shaped frame body 200B. In addition, the movable element 20C includes a movable block 200C selectively contacting the position-limiting element 201B or separated from the position-limiting element 201B and two pivot posts 201C respectively disposed on two opposite lateral sides of the movable block 200C and respectively slidably disposed in the two arc-shaped sliding grooves 202B. Therefore, the movable block 200C of the movable element 20C can selectively contact the door D of the wafer carrier device C (as shown in FIG. 2B) or insert into the wafer carrier device C from the wafer pick-and-place opening P (as shown in FIG. 2C). However, the movable structure 20 used in the second embodiment is merely an example and is not meant to limit the instant disclosure.

In conclusion, referring to FIG. 2B, when the door D of the wafer carrier device C is closed, one end of the movable structure 20 (such as the movable block 200C) can contact the door D of the wafer carrier device W and the bottom of the wafer carrier device C can simultaneously contact all of the contact sensors 110, thus the door detection system of the instant disclosure can obtain the information that the door D of the wafer carrier device C has been closed. In addition, referring to FIG. 2C, when the door D of the wafer carrier device C is not closed, one end of the movable structure 20 (such as the movable block 200C) can be inserted into the wafer carrier device C from the wafer pick-and-place opening P and the bottom of the wafer carrier device C only can simultaneously contact some of the contact sensors 110, thus the door detection system of the instant disclosure can obtain the information that the door D of the wafer carrier device C has not been closed.

[Third Embodiment]

Figure 3A:
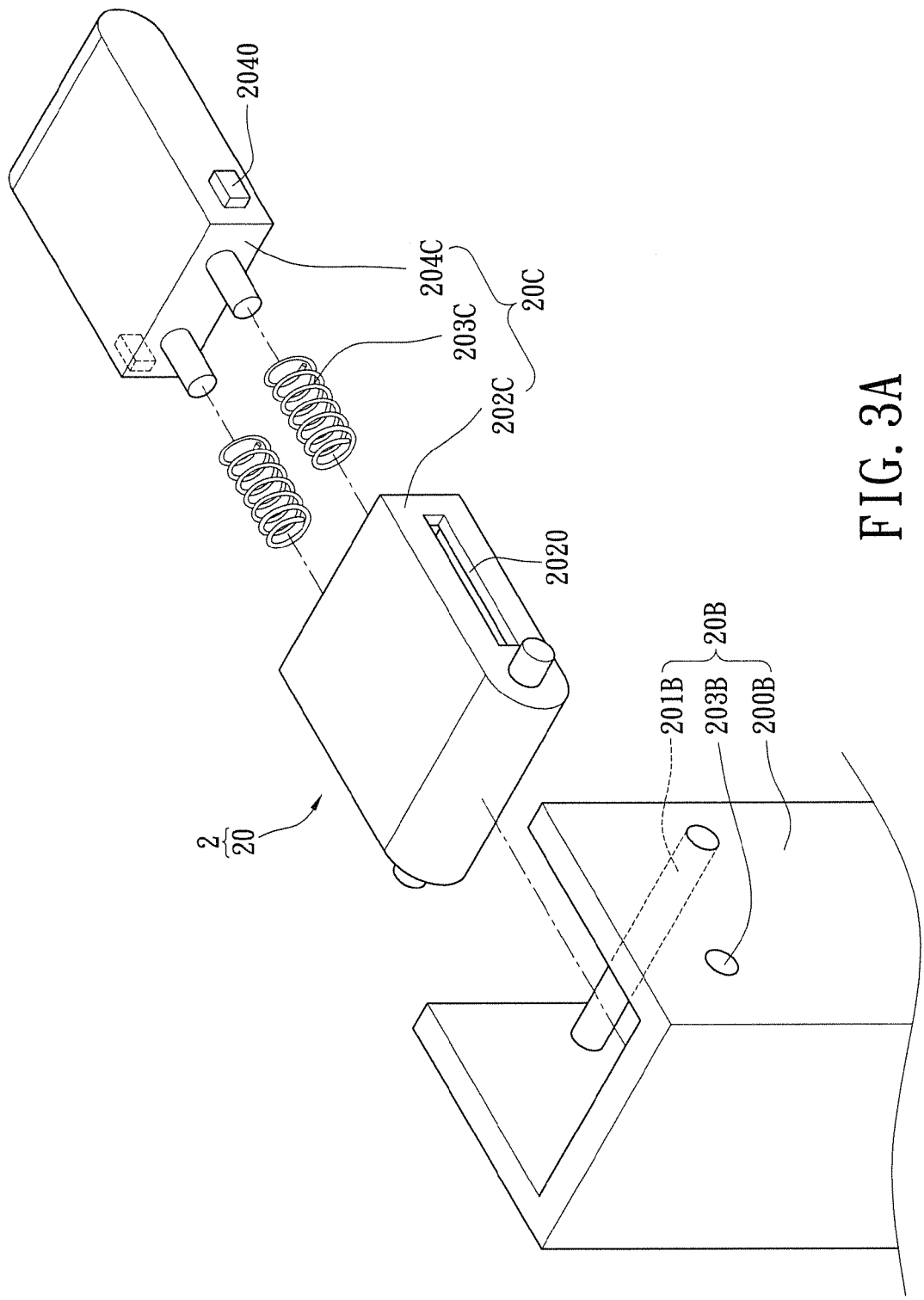
FIG. 3A shows a partial, perspective, exploded, schematic view of the movable unit according to the third embodiment of the instant disclosure.
Figure 3B:
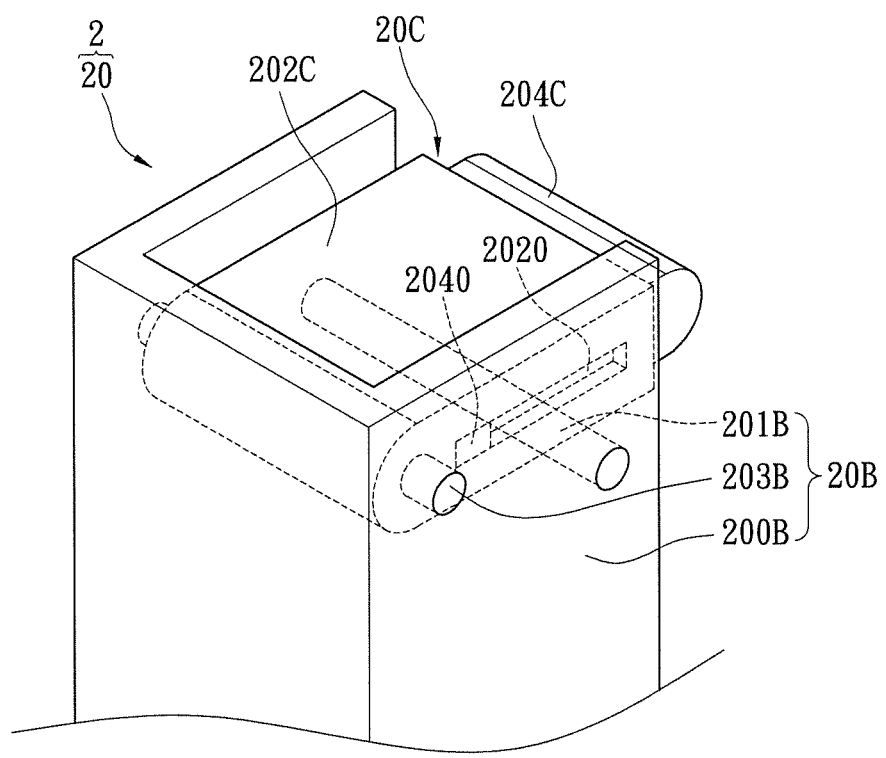
FIG. 3B shows a lateral, schematic view of the movable unit contacting the door of the wafer carrier device according to the third embodiment of the instant disclosure.
Figure 3C:
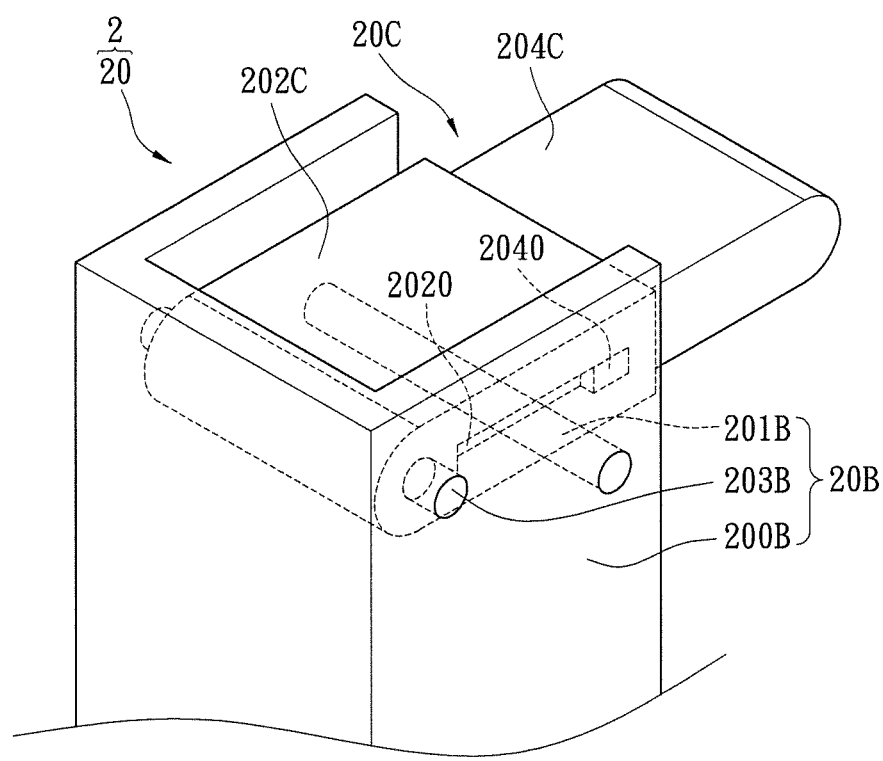
FIG. 3C shows a lateral, schematic view of the movable unit inserted into the wafer carrier device from the wafer pick-and-place opening according to the third embodiment of the instant disclosure.

Referring to FIGS. 3A to 3C, where the third embodiment of the instant disclosure provides a door detection system for judging whether a door D of a wafer carrier device C is closed or not. Comparing FIG. 3B with FIG. 1C and comparing FIG. 3C with FIG. 1D, the difference between the third embodiment and the first embodiment is as follows: in the third embodiment, the movable structure 20 includes a fixing seat 20A fixed on the bearing platform 10 (as shown in FIG. 2A), a support frame 20B movably disposed on the fixing seat 20A, and a movable element 20C movably disposed on the support frame 20B to selectively contact the door D of the wafer carrier device W (as shown in FIG. 3B) or insert into the wafer carrier device C from the wafer pick-and-place opening P (as shown in FIG. 3C).

For example, the support frame 20B includes a U-shaped frame body 200B, a position-limiting element 201B disposed between two inner walls of the U-shaped frame body 200B, and two positioning holes 203B symmetrically formed on the U-shaped frame body 200B. In addition, the movable element 20C includes a fixing block 202C fixed between the two positioning holes 203B, at least one elastic element 203C (such as spring, elastic piece, etc.) received in the fixing block 202C, and a sliding block 204C contacting the elastic element 203C and slidably mated with fixing block 202C, and the sliding block 204C has two sliding protrusions 2040 respectively slidably disposed in two sliding slots 2020 of the fixing block 202C. Therefore, the sliding block 204C of the movable element 20C can selectively contact the door D of the wafer carrier device C (as shown in FIG. 3B) or insert into the wafer carrier device C from the wafer pick-and-place opening P (as shown in FIG. 3C). However, the movable structure 20 used in the second embodiment is merely an example and is not meant to limit the instant disclosure.

In conclusion, referring to FIG. 3B, when the door D of the wafer carrier device C is closed, one end of the movable structure 20 (such as the sliding block 204C) can contact the door D of the wafer carrier device W and the bottom of the wafer carrier device C can simultaneously contact all of the contact sensors 110, thus the door detection system of the instant disclosure can obtain the information that the door D of the wafer carrier device C has been closed. In addition, referring to FIG. 3C, when the door D of the wafer carrier device C is not closed, one end of the movable structure 20 (such as the sliding block 204C) can be inserted into the wafer carrier device C from the wafer pick-and-place opening P and the bottom of the wafer carrier device C only can simultaneously contact some of the contact sensors 110, thus the door detection system of the instant disclosure can obtain the information that the door D of the wafer carrier device C has not been closed.

Therefore, because one end of the at least one movable structure can selectively contact the door of the wafer carrier device or been inserted into the wafer carrier device from the wafer pick-and-place opening, the door detection system of the instant disclosure can be used to judge whether a door of a wafer carrier device is closed or not.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A door detection system for judging whether a door of a wafer carrier device is closed, comprising:
a robot arm unit including at least one bearing platform and at least one level sensing structure disposed on the at least one bearing platform, wherein the level sensing structure includes a plurality of contact sensors, and the wafer carrier device is disposed on the at least one level sensing structure; and
a movable unit including at least one movable structure disposed on the robot arm unit, wherein the wafer carrier device has a wafer pick-and-place opening corresponding to the door;
wherein when the door of the wafer carrier device is closed, one end of the at least one movable structure contacts the door of the wafer carrier device and the bottom of the wafer carrier device simultaneously contacts all of the contact sensors;
wherein when the door of the wafer carrier device is not closed, one end of the at least one movable structure is inserted into the wafer carrier device from the wafer pick-and-place opening and the bottom of the wafer carrier device simultaneously contacts some of the contact sensors.

2. The door detection system of claim 1, wherein the at least one movable structure includes a fixing portion fixed on the at least one bearing platform, a flexible extending portion extended upwardly from the fixing portion, and a contacting portion bent from the flexible extending portion to selectively contact the door of the wafer carrier device or insert into the wafer carrier device from the wafer pick-and-place opening.

3. The door detection system of claim 1, wherein the at least one movable structure includes a fixing seat fixed on the at least one bearing platform, a support frame movably disposed on the fixing seat, and a movable element movably disposed on the support frame to selectively contact the door of the wafer carrier device or insert into the wafer carrier device from the wafer pick-and-place opening.

4. The door detection system of claim 3, wherein the support frame includes a U-shaped frame body, a position-limiting element disposed between two inner walls of the U-shaped frame body, and two arc-shaped sliding grooves symmetrically formed on the U-shaped frame body, wherein the movable element includes a movable block selectively contacting the position-limiting element or separated from the position-limiting element and two pivot posts respectively disposed on two opposite lateral sides of the movable block and respectively slidably disposed in the two arc-shaped sliding grooves, and the movable block of the movable element selectively contacts the door of the wafer carrier device or inserts into the wafer carrier device from the wafer pick-and-place opening.

5. The door detection system of claim 3, wherein the support frame includes a U-shaped frame body, a position-limiting element disposed between two inner walls of the U-shaped frame body, and two positioning holes symmetrically formed on the U-shaped frame body, wherein the movable element includes a fixing block fixed between the two positioning holes, at least one elastic element received in the fixing block, and a sliding block contacting the at least one elastic element and slidably mated with fixing block, and the sliding block of the movable element selectively contacts the door of the wafer carrier device or inserts into the wafer carrier device from the wafer pick-and-place opening.

6. A door detection system for judging whether a door of a wafer carrier device is closed, comprising:
a robot arm unit including at least one bearing platform and at least one level sensing structure disposed on the at least one bearing platform, wherein the level sensing structure includes a plurality of contact sensors, and the wafer carrier device is disposed on the at least one level sensing structure; and a movable unit including at least one movable structure disposed on the robot arm unit, wherein the wafer carrier device has a wafer pick-and-place opening corresponding to the door, and one end of the at least one movable structure selectively contacts the door of the wafer carrier device or inserts into the wafer carrier device from the wafer pick-and-place opening.

7. The door detection system of claim 6, wherein the at least one movable structure includes a fixing portion fixed on the at least one bearing platform, a flexible extending portion extended upwardly from the fixing portion, and a contacting portion bent from the flexible extending portion to selectively contact the door of the wafer carrier device or insert into the wafer carrier device from the wafer pick-and-place opening.

8. The door detection system of claim 6, wherein the at least one movable structure includes a fixing seat fixed on the at least one bearing platform, a support frame movably disposed on the fixing seat, and a movable element movably disposed on the support frame to selectively contact the door of the wafer carrier device or insert into the wafer carrier device from the wafer pick-and-place opening.

9. The door detection system of claim 8, wherein the support frame includes a U-shaped frame body, a position-limiting element disposed between two inner walls of the U-shaped frame body, and two arc-shaped sliding grooves symmetrically formed on the U-shaped frame body, wherein the movable element includes a movable block selectively contacting the position-limiting element or separated from the position-limiting element and two pivot posts respectively disposed on two opposite lateral sides of the movable block and respectively slidably disposed in the two arc-shaped sliding grooves, and the movable block of the movable element selectively contacts the door of the wafer carrier device or inserts into the wafer carrier device from the wafer pick-and-place opening.

10. The door detection system of claim 8, wherein the support frame includes a U-shaped frame body, a position-limiting element disposed between two inner walls of the U-shaped frame body, and two positioning holes symmetrically formed on the U-shaped frame body, wherein the movable element includes a fixing block fixed between the two positioning holes, at least one elastic element received in the fixing block, and a sliding block contacting the at least one elastic element and slidably mated with fixing block, and the sliding block of the movable element selectively contacts the door of the wafer carrier device or inserts into the wafer carrier device from the wafer pick-and-place opening.

* * * * *